(12) United States Patent
Miyasato et al.

(10) Patent No.: US 6,283,166 B1
(45) Date of Patent: Sep. 4, 2001

(54) WOVEN GLASS FABRICS AND LAMINATE FOR PRINTED WIRING BOARDS

(75) Inventors: Keita Miyasato; Eiji Sato, both of Fukushima (JP)

(73) Assignee: Nitto Boseki Co., Ltd., Fukushima (JP)

( * ) Notice: Subject to any disclaimer, the term of this patent is extended or adjusted under 35 U.S.C. 154(b) by 0 days.

(21) Appl. No.: 09/402,005

(22) PCT Filed: Feb. 9, 1999

(86) PCT No.: PCT/JP99/00549

§ 371 Date: Sep. 27, 1999

§ 102(e) Date: Sep. 27, 1999

(87) PCT Pub. No.: WO99/41441

PCT Pub. Date: Aug. 19, 1999

(30) Foreign Application Priority Data

Feb. 10, 1998 (JP) ................................................. 10-042947

(51) Int. Cl.⁷ .................................................. D03D 23/00
(52) U.S. Cl. ................. 139/383 R; 139/420 R; 139/426 R; 442/233
(58) Field of Search ........................ 139/383 R, 420 R, 139/426 R; 442/233

(56) References Cited

U.S. PATENT DOCUMENTS

| | | |
|---|---|---|
| 4,550,051 * | 10/1985 | Spielau et al. .................... 442/233 |
| 4,707,565 * | 11/1987 | Kasai et al. ........................ 174/255 |
| 4,943,334 | 7/1990 | Medney et al. . |
| 5,047,279 * | 9/1991 | Nasu et al. ........................... 428/156 |
| 5,269,863 * | 12/1993 | Middelman ........................ 156/177 |

FOREIGN PATENT DOCUMENTS

| | | |
|---|---|---|
| 62-276053 | 11/1987 | (JP) . |
| 1-216829 | 8/1989 | (JP) . |
| 1-216830 | 8/1989 | (JP) . |
| 4-270657 | 9/1992 | (JP) . |
| 6-136632 | 5/1994 | (JP) . |
| 7-66513 | 3/1995 | (JP) . |
| 7-90606 | 10/1995 | (JP) . |
| 7-90607 | 10/1995 | (JP) . |
| 8-18180 | 1/1996 | (JP) . |
| 8-39686 | 2/1996 | (JP) . |

\* cited by examiner

*Primary Examiner*—John J. Calvert
*Assistant Examiner*—Robert H. Muromoto, Jr.
(74) *Attorney, Agent, or Firm*—Foley & Lardner

(57) ABSTRACT

A glass woven fabric composed of glass fiber warp threads and glass fiber weft threads, characterized in that the glass fiber warp threads are woven with the glass fiber weft threads at intervals of at least 10 mm in each of the warp and weft directions and characterized by comprising a glass fiber woven fabric portion having non-woven portions in each of which a warp layer in which only the glass fiber warp threads are successively placed side by side and a weft layer in which only the glass fiber weft threads are successively placed side by side are laminated.

When the glass woven fabric of this invention is used, a printed wiring board excellent in dimensional stability and surface smoothness can be provided.

4 Claims, 3 Drawing Sheets

WOVEN GLASS FABRICS AND LAMINATE FOR PRINTED WIRING BOARDS

TECHNICAL FIELD

This invention relates to a glass woven fabric which is used as a base material for a printed wiring board to be used in electronic equipment, computer, communication equipment and the like, and to a laminate for printed wiring board in which the above glass woven fabric is used as a base material.

BACKGROUND ART

Glass fibers are broadly used in the electronics field because of their excellent thermal resistance, dimensional stability, electrical characteristics and the like, and in particular, glass woven fabrics prepared by subjecting glass fibers to weaving are much in demand as a base material for a printed wiring board because of their excellent characteristics.

Such a packaging system is now increasing that IC or the like is automatically inserted into a printed wiring board. This automatic insertion is accompanied by drying of solder resist, heating such as fusing or the like, etc, and hence, the printed wiring board becomes exposed to severe conditions. Therefore, that the printed wiring board is changed in dimension by heat has become a problem. Particularly, when the dimensional change in the warp direction and that in the weft direction are different, it follows that anisotropy is caused in the warp and weft directions in the step of processing the printed wiring board.

Thus, the dimensional stability level in the conventional printed wiring boards has become unsatisfactory, and a printed wiring board free from anisotropy as to dimensional change has become necessary.

Moreover, in the case of conventional glass woven fabrics prepared by plain weave, fine irregularities resulting from the weave pattern of the woven fabric appear on the surface of the base board. As in recent years, the wiring of the printed wiring board has been made finer and the wiring density has been made higher, and therefore, it has been necessary that the irregularities be as small in number as possible.

In order to solve such problems, a printed wiring board has been proposed in which a unidirectionally arranged woven fabric of glass fibers (referred to herein-after as the UD material) is used as a base material. For example, JP-A-1-216,829, JP-A-1-216,830, JP-A-4-270,657, JP-B-7-90,606, JP-B-7-90,607, JP-A-8-39,686 and the like disclose a process and apparatus for producing a printed wiring board in which the UD material is used.

The production of a printed wiring board in which the UD material is used as a base material is characterized in that the printed wiring board can be produced without undergoing the conventional weaving step, varnish-impregnating step and pressing step, but there must be prepared its own peculiar production devices such as a yarn-arranging device and a continuously resin-coating device, and hence, a new investment in plant and equipment is required. Moreover, the above production has many undissolved technical problems and has not reached a practical use stage.

Furthermore, in recent years, a remarkable advance has been seen with respect to a technique of perforating the printed wiring board with a laser. However, when a printed wiring board in which a glass woven fabric is used as the base material is subjected to laser processing, such a problem is caused in some cases that holes having a uniform diameter cannot be perforated because in the conventional glass woven fabric of plain weave, present are portions in which fibers are woven with one another and portions of resin alone.

Accordingly, an object of this invention is to provide a glass woven fabric having characteristics equivalent to conventional unidirectionally arranged woven fabrics (the UD material), and to thereby make it possible to obtain a printed wiring board excellent in dimensional stability and surface smoothness by the conventional process, as it is, for producing a printed wiring board which is now generally used.

Another object is to provide a printed wiring board which enables the uniform perforation when the printed wiring board is subjected to perforation with a laser.

DISCLOSURE OF INVENTION

This invention has been made for achieving the above-mentioned objects and is a glass woven fabric composed of glass fiber warp threads and glass fiber weft threads, characterized in that the glass fiber warp threads are woven with the glass fiber weft threads at intervals of at least 10 mm in each of the warp and weft directions and characterized by comprising a glass fiber woven fabric portion having non-woven portions in each of which a warp layer in which only the above glass fiber warp threads are successively placed side by side and a weft layer in which only the above glass fiber weft threads are successively placed side by side are laminated.

That is to say, in the glass woven fabric of this invention, such crossing that the up-and-down relation between the glass fiber warp thread and the glass fiber weft thread is reversed, namely weaving, is not caused over at least 10 mm in the warp direction and over at least 10 mm in the weft direction. Accordingly, in the above-mentioned non-woven portions, each of which is a tetragonal region in which weaving of the above warp threads with the above weft threads is not caused, the warp layer in which only the warp threads are successively placed side by side (referred to hereinafter merely as "the warp layer" in some cases) and the weft layer in which only the weft threads are successively placed side by side (referred to herein-after merely as "the weft layer" in some cases) are present in the form of a laminate.

In this invention, the thread count in 25 mm of glass woven fabric (density of yarn) is not particularly limited; however, when the performance of a loom of thread is taken into consideration, the thread count is generally 10 to 100, preferably 30 to 80 and most preferably 30 to 60 in both warp and weft. Accordingly, when this is applied to the glass woven fabric of this invention, it follows that glass fiber warp threads and glass fiber weft threads are woven in a unit of about 8 to 40 threads or more.

Moreover, in the glass woven fabric of this invention as a base material for the printed wiring board, the above-mentioned glass fiber woven fabric portion may have, at its both ends, weave texture portions of glass fiber, the weave texture of which is selected from the group consisting of plain weave texture, twill weave texture and satin weave texture and, in addition, continuous weave texture portions having a width of at least 2 mm, the weave texture of which is selected from the group consisting of plain weave texture, twill weave texture and satin weave texture, may exist between the non-woven portions of the above-mentioned glass fiber woven fabric portion, at intervals of at least 10 mm in the warp direction and/or the weft direction.

Furthermore, the ratio between the glass fiber amounts per 25 mm in the warp and weft directions of the above-mentioned glass fiber woven fabric [(number of glass fiber warp threads×denier of glass fiber warp thread)/(number of glass fiber weft threads×denier of glass fiber weft thread)] is preferably 0.7 to 1.4.

Also, this invention includes a prepreg prepared by impregnating and coating the above-mentioned glass woven fabric with a synthetic resin and also a printed wiring board in which the above-mentioned glass woven fabric is used as a base material.

BRIEF DESCRIPTION OF DRAWINGS

In FIG. 5, the symbols A and B are the sectional views of the prepregs of this invention, 2 refers to a glass fiber warp and 3 refers to a glass fiber weft.

BEST MODE FOR CARRYING OUT THE INVENTION

Figure 1:
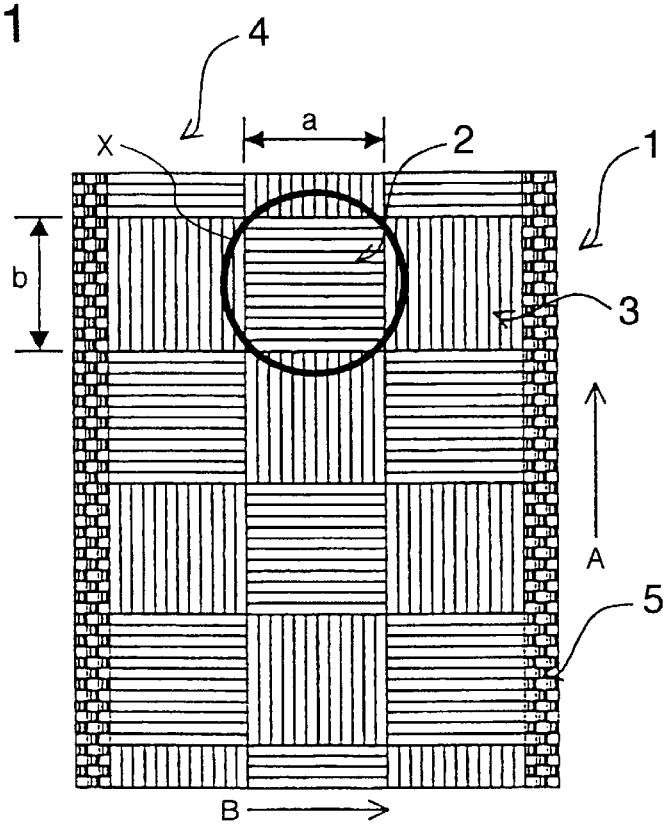
FIG. 1 is a plan view showing an embodiment of the glass woven fabric of this invention. Incidentally, A shows the warp direction and B shows the weft direction.

As stated above, the glass woven fabric of this invention is characterized in that such a weave that the up-and-down relation between the glass fiber warp and the glass fiber weft is reversed is not caused over at least 10 mm in the warp direction and over at least 10 mm in the weft direction. In FIG. 1, an embodiment of the glass woven fabric of this invention is shown. It is characteristic of the glass woven fabric 1 of this invention that the glass woven fabric 1 of this invention is composed of the glass fiber weft threads 2 and the glass fiber warp threads 3 and that the lengths a and b in FIG. 1 are at least 10 mm.

Figure 4:
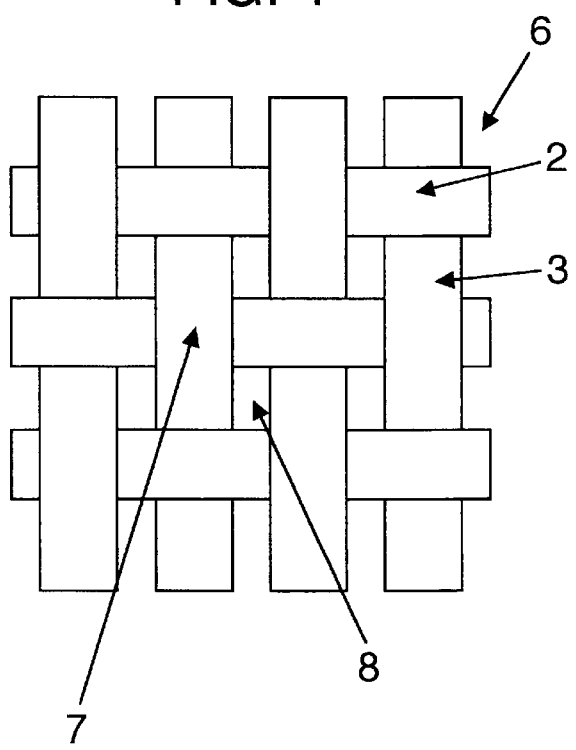
FIG. 4 is an enlarged plan view of a conventional glass woven fabric.

On the other hand, in the case of a conventional usual plain weave, as shown in FIG. 4, the warp threads 3 are woven alternately with the weft threads 2 to form a weave texture. However, in the case of this invention, the warp threads are woven with the weft threads at intervals of at least 10 mm.

In the tetragonal, non-woven portion X in a circle in FIG. 1, the glass fiber warp threads 3 are in such a state that they are put on the back side of the portion of the glass fiber weft threads 2 shown in the figure, and at least in this portion, this state can be understood to be the state that a weft layer in which only the unidirectionally arranged weft threads 2 are successively placed side by side is put on a warp layer in which only the warp threads 3 which are orthogonal to the weft threads and are unidirectionally arranged are successively placed side by side. That is to say, in the glass woven fabric 1 of this invention, the glass fiber weft threads 2 are woven with the glass fiber warp threads 3 in a unit of about 8 to 40 threads or more, so that said state can be understood to be the state that a warp layer and a weft layer, each of which is composed of glass fibers of a unit of about 8 to 40 threads or more, are laminated to each other. Accordingly, speaking of this portion only, it can be said that the portion is in the most desirable state as a base material for a printed wiring board.

Here, the reason why the lower limit of the intervals at which the glass fiber warp threads are woven with the glass fiber weft threads is defined as at least 10 mm is that one side of a chip for semiconductor package as seen in CSP, BGA and PGA and one side of a chip for base board to be mounted on an IC card or the like have a size of at least 10 mm. When the chip is packaged in conformity with this portion, an effect equivalent to a laminate for a printed wiring board in which the UD material is used as a base board can be obtained.

Figure 2:
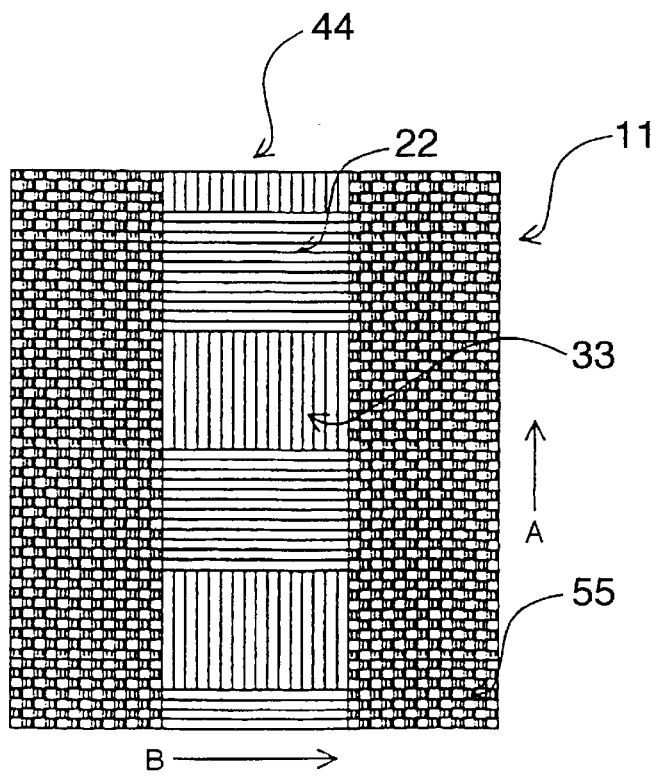
FIG. 2 is a plan view showing another embodiment of the glass woven fabric of this invention. Incidentally, A shows the warp direction and B shows the weft direction.

On the other hand, the upper limit of the interval at which the glass fiber warp threads are woven with the glass fiber weft threads is not particularly limited, and as shown in FIG. 2, the total width obtained by removing the portion of the weave texture 22 from the width of the glass woven fabric 11 can be made, for example, 1,200 mm. However, it is necessary to take into consideration the effective press area in a pressing machine, so that the upper limit is actually about 650 mm, and it is preferable that the above interval is preferably 600 mm, more preferably in a range of about 400 mm.

Moreover, the shape of the unit of the lamination region of the warp layer and the weft layer, namely, the non-woven portion is not always square and may be rectangular. That is, in FIG. 1, the values of a and b may be different.

FIG. 2 is a view showing another embodiment of the glass woven fabric of this invention. The glass woven fabric 11 is composed of the glass fiber warp threads 22 and the glass fiber weft threads 33, and the glass fiber woven fabric portion 44 has weave texture portions 55 as selvedge at both ends. In the weave texture portions 55, the warp threads and the weft threads are woven alternately to form a plain weave. However, in the glass fiber woven fabric portion 44, the warp threads and the weft threads are woven in the width of this portion, and the glass fiber woven fabric portion 44 has such a constitution that a non-woven portion in which the warp layer and the weft layer are laminated so that the warp layer comes above the weft layer and another non-woven portion in which the weft layer and the warp layer are laminated so that the weft layer comes above the warp layer appear alternately in the warp direction.

When the glass woven fabric of this invention is provided with the weave texture portions 5 and 55 as shown in FIG. 1 and FIG. 2, its effect as selvedge for the glass fiber woven fabric portions 4 and 44 of this invention, the weave texture of which is a loose weave texture, is improved, and the handleability of the glass woven fabric is exerted. As the weave texture portions 5 and 55, plain weave, twill weave, satin weave and the like can be used; however, the plain weave is desirable in the respect that the texture is strongest. The plain weave includes mat weave considered to be a derivative weave texture of the plain weave and the like. The widths of the weave texture portions 5 and 55 are required to be at least 2 mm.

Figure 3:
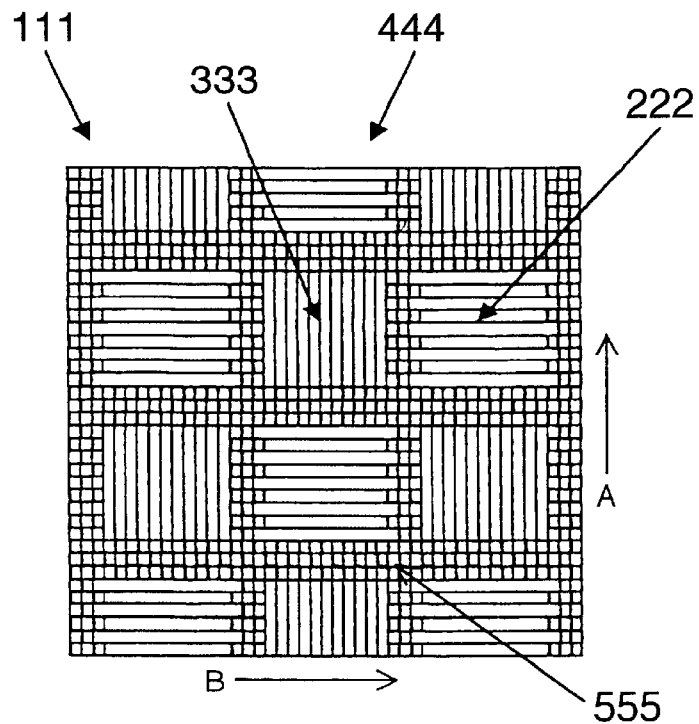
FIG. 3 is a plan view showing a further embodiment of the glass woven fabric of this invention. Incidentally, A shows the warp direction and B shows the weft direction.

Furthermore, FIG. 3 shows a further embodiment of the glass woven fabric of this invention, in which continuous weave textures 555 such as plain weave, twill weave, satin weave and the like are allowed to exist at intervals of at least 10 mm in the warp and weft directions of the glass fiber woven fabric portion 444. The glass fiber woven fabric portion 444 has a loose weave texture, so that when a prepreg is prepared by a varnish-impregnation step requiring an upright drying oven, a deflection of the warp thread is caused in the direction opposite to the coating direction owing to the weight of the impregnated resin in some cases with an increase of weaving width of the glass woven fabric, and in some cases, the appearance of the prepreg prepared is not good. In order to prevent the deflection from being caused during the preparation of the prepreg, a pattern-holding weave texture 555 having a very narrow width is provided at constant intervals as shown in FIG. 3 or intermittently.

Thus, FIG. 3 shows an example in which the deflection of the weft thread 222 has been prevented in the glass woven fabric 111 of this invention. The base material 111 is composed of the weft threads 222 and the warp threads 333, and has pattern-holding weave texture portions 555 intermittently at intervals of at least 10 mm throughout the glass fiber woven fabric 444. As the pattern-holding weave texture portion 555, plain weave, twill weave, satin weave or the like can be used; however, plain weave is desirable because the texture is strongest. The plain weave includes mat weave considered to be a derivative texture of plain weave and the like. The width of the pattern-holding weave texture 555 may be of one to several warp threads for some uses; however, usually a width of 2 mm or more is sufficient, and it is preferably in the range of 4 mm to 6 mm. Moreover, it is not essential that the pattern-holding weave texture portion 555 exists in both the warp and weft directions as shown in FIG. 3 and it may exist in any one of the warp and weft directions.

In the glass woven fabric of this invention, the ratio between the glass fiber amount per 25 mm of warp and that of weft is preferably in the range of 0.7 to 1.4. Incidentally, the ratio of the glass fiber amounts is determined by (number of glass fiber warp threads×denier of glass fiber warp thread)/(number of glass fiber weft threads×denier of glass fiber weft thread).

When a 7628 type loom which has been generally used for a glass woven fabric as a base material for a printed wiring board is used, the warp and weft thread counts per 25 mm are 44 and 32, respectively, and the ratio between the glass fiber amount per 25 mm of warp and that of weft becomes 1.4. Accordingly, in this invention, the weft-driving gear and the warp beam in this 7628 type woven fabric can be diverted, as they are, to this invention, whereby the glass woven fabric of this invention can be produced at low cost.

However, in order to make the dimensional stability of the base board better, it is more desirable that the ratio between the glass fiber amount per 25 mm of warp and that of weft is in the range of 0.8 to 1.2, and also, in order to make the difference between the dimensional changes in the warp and weft directions small, it is more preferable to allow the ratio between the glass fiber amounts to fall within the range of 0.9 to 1.1. Even when warp threads and weft threads which are different in thread size are woven with each other, it is preferable to allow the ratio between the glass fiber amount per 25 mm of warp and that of weft to fall within the range of 0.7 to 1.4, more preferably 0.8 to 1.2 and most preferably 0.9 to 1.1.

As the glass fiber to be used in the glass woven fabric of this invention, there can be used fibers of glass comprising $SiO_2$ as the main component such as E glass, S glass, D glass, Q glass or the like which has heretofore been used as a base material for a printed wiring board. Glass fibers whose filament diameters are in the range of 3 to 13 $\mu$m can be used. When the filament diameter is less than 3 $\mu$m, the workability such as weavability or the like is inferior and when it is more than 13 $\mu$m, the drill-processability in the perforation of a conventional drill bit is deteriorated though no problem is caused in the perforation with a laser. In general, the filament diameter is desirably in a range of 5 to 10 um. Glass fibers whose fineness is 20 to 25,000 deniers can be used. When a fiber thicker than 25,000 deniers is used, it has a merit in economy because the weaving efficiency is increased; on the other hand, it follows that the weave texture portions provided for preparing selvedges at the ends of the woven fabric have a rough texture, so that a weave texture having a broad width becomes necessary. Accordingly, from the viewpoint that the thickness of fiber is desirably in such a range that the selvedge can be prepared in a width of about 2 mm, it is preferable to use glass fibers of up to 25,000 deniers. Moreover, for obtaining the selvedge effect, it is necessary that weft threads be woven at least three times into the glass woven fabric in its weft direction.

The number of twists of glass fiber threads is not particularly limited; however, the smaller the number of twists, the more desirable, and non-twisted threads may be used. Also, doubled-twisted threads can also be used.

In the glass fiber used in this invention, a sizing agent of a starch type can be used. In this case, the glass woven fabric is subjected to heat cleaning by conventional procedure and then to surface treatment with a silane coupling agent. As the silane coupling agent, those which have heretofore been known can be appropriately used.

The silane coupling agent is usually used in the form of an aqueous solution, a solution in an organic solvent such as an alcohol, a ketone, a glycol, an ether, dimethylformamide or the like or a solution in a mixed solvent of water with the above organic solvent at a concentration of 0.01 to 5% by weight. The amount of the silane coupling agent applied to the surface of the glass fiber (in terms of solid content) is preferably in the range of 0.001 to 0.5% by weight, more preferably in the range of 0.01 to 0.2% by weight.

In the glass fiber to be used in this invention, a synthetic resin type sizing agent can also be used without using the starch type sizing agent. For example, an epoxy resin modified by amine addition or ethylene oxide addition, a urethane resin modified by amine addition or ethylene oxide addition, or the like is used as the main component and a silane coupling agent is also incorporated into the sizing agent. In this case, it is not necessary to remove the sizing agent, and the glass woven fabric produced by weaving can be subjected as such to the prepreg step.

As to the glass woven fabric of this invention, it is sufficient that the thickness is in the range of 0.03 to 0.4 mm and the mass is in the range of 30 to 400 $g/m^2$.

The loom for weaving the glass woven fabric of this invention may be any one which is generally used in the weaving of a glass woven fabric and is not particularly limited, and there can be used an air jet loom, a shuttle loom, a rapier loom and the like. When the weave texture portions are separately provided at both ends of the glass fiber woven fabric portion, it is desirable to take a procedure such as a method in which a tension controller is placed to absorb the unevenness of tension in the warp due to the difference in texture between the glass fiber woven fabric portion and the weave texture portions at both ends or a beam for the weave texture portions at both ends and a beam for the glass fiber woven fabric portion in the middle are separately placed to control the respective tensions, or the like. Moreover, even when a pattern-holding weave texture portion is provided separately in the glass fiber woven fabric portion in order to prevent the deflection of warp from being caused, it is desirable to take a procedure by the above-mentioned method similarly to the case where weave texture portions are provided at both ends of the glass fiber woven fabric portion.

The prepreg for the printed wiring board of this invention is prepared by impregnating the glass woven fabric of this invention with a synthetic resin such as an epoxy resin, a polyimide resin or the like. As the synthetic resin, a thermosetting resin and a thermoplastic resin can be used; however, a thermosetting resin is desirable. As the thermosetting resin to be used in this invention, epoxy resins, polyimide resins, polyester resins, phenolic resins and the like are used alone or in admixture. These thermosetting resins may be of a solvent type or a solventless type. Incidentally, the method of impregnating the glass woven fabric with the resin is carried out by conventional procedure and the resin content is desirably in the range of 20 to 70%.

As the epoxy resin to be used in this invention, those which have heretofore been known can be appropriately used. For example, diglycidyl ether of bisphenol A, diglycidyl ether of bisphenol F, brominated epoxy resin, polyglycidyl ether of novolac resin and the like are mentioned.

Moreover, as the phenolic resin, those which have heretofore been known can be appropriately used. As representatives thereof, there are mentioned novolac type phenolic resins, resole type phenolic resins, hydrocarbon-modified phenolic resins, silicone resin-modified phenolic resins, epoxy resin-modified phenolic resins and the like.

Figure 5:
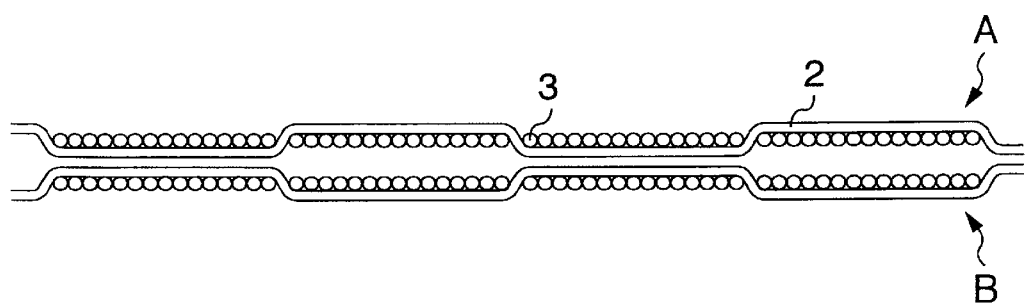
FIG. 5 is a view showing the method of piling prepregs in the production of the printed wiring board of this invention.

The laminate for a printed wiring board of this invention comprises the above-mentioned glass woven fabric as the base material and may have an electrically conductive metal foil layer composed of copper, gold, silver or the like, and it is suitable as a material for a printed wiring board and the like. In the preparation of the laminate for a printed wiring board of this invention, only one sheet of the above-mentioned prepreg may be used or a pile of at least two sheets of the prepreg may be used. Incidentally, the number of sheets of the prepreg to be piled may be odd or even. Moreover, the method of laminating prepregs is not particularly limited; however, from the viewpoint of preventing a warpage of laminate from being caused, it is preferable to laminate even sheets of the prepreg so that the direction of the glass fiber of each prepreg sheet becomes axially symmetrical to the center line in the thickness direction of the laminate as shown in FIG. 5. Incidentally, the laminate of this invention may be provided with internal layer wirings.

As stated above, in the glass woven fabric of this invention, such a weave that the up-and-down relation between the glass fiber warp thread and the glass fiber weft thread is reversed is not caused over at least 10 mm in the warp direction and over at least 10 mm in the weft direction, and in the non-woven portion in which the above-mentioned weave of warp thread with weft thread is not caused, a warp layer in which only the warp threads are successively placed side by side and a weft layer in which only the weft threads are successively placed side by side are present in the form of a laminate. That is to say, the laminate for a printed wiring board of this invention uses a unidirectional glass woven fabric as a base material, and hence, it follows that the non-woven portion in which the warp layer and the weft layer are laminated has the same effect as when the UD material is used as a base material. Accordingly, the non-woven portion in the glass woven fabric of this invention is smaller in the number of irregular places than the conventional plain weave texture in which glass fibers are alternately crossed up and down into a weave, and when the glass woven fabric is formed into a laminate, the surface smoothness of the laminate can be remarkably improved. Furthermore, in the non-woven portion, the bundling effect of glass fiber is small, so that the resin-impregnating properties are improved, whereby it becomes possible to obtain a laminate excellent in heat resistance. In addition, this non-woven portion is small in thermal shrinkage, too, so that it becomes possible to produce a laminate having a good dimensional stability.

In addition, when a printed wiring board is produced using the glass woven fabric of this invention, the new equipment necessary for use of the UD material is not required, and since one sheet of glass woven fabric (prepreg) contains therein a laminate structure of the two glass fiber layers referred to above as the warp layer and the weft layer, the production efficiency is very good as compared with that in the case where the UD material having only one glass fiber layer is used.

Moreover, in the glass woven fabric of this invention, the number of the crossings that the up-and-down relation between warp thread and weft thread is reversed, namely the number of weavings, is small, and hence, it is possible to make the thread count larger than in the case of the conventional plain weave texture and to obtain a glass woven fabric having a dense texture. FIG. 4 shows a glass woven fabric of a conventional plain weave texture, and 7 refers to the portion in which the warp threads and the weft threads are crossed with each other so that the up-and-down relation between the two is reversed, that is, the portion in which the warp threads and the weft threads are woven, and 8 to a space portion surrounded with the warp threads and the weft threads.

In the glass woven fabric of this invention, this space portion 8 can be made small, and hence, when the laminate is perforated with a laser, the energy loss of the laser can be reduced, and the uniform perforation of the laminate is made possible.

EXAMPLES

Examples of this invention are explained below. Incidentally, "%" and "part" in the following description mean "% by weight" and "part by weight", respectively, unless otherwise specified.

EXAMPLE

Production of Glass Woven Fabric

1. Weaving of Glass Woven Fabric

As a glass woven fabric, there was used a glass woven fabric obtained by weaving under the following conditions.

| | | | |
|---|---|---|---|
| Warp thread | ECE225 | 1/0 | Glass thread |
| Weft thread | ECE225 | 1/0 | Glass thread |
| Thread count of warp | | | 59/25 mm |
| Thread count of weft | | | 59/25 mm |
| Mass | | | 105 g/m$^2$ |
| Thickness | | | 0.10 mm |
| Length of non-woven portion | | | |
| Warp direction | | | 350 mm |
| Weft direction | | | 350 mm |

-continued

| Weave texture portion | |
|---|---|
| Plain weave, width: | 5 mm. |

2. Surface Treatment of Glass Woven Fabric

As a silane coupling agent, there was used N-β-(N-vinylbenzylaminoethyl)-γ-aminopropyltrimethoxysilane hydrochloride [manufactured by TORAY•DOW CORNING•SILICONE CO., LTD.; SZ-6032], and an aqueous solution containing 0.5% (solid content) of this silane coupling agent and 3.0% of acetic acid was obtained. Thereafter, a small amount of methanol was added to this aqueous solution to prepare a treating solution containing the silane coupling agent.

Subsequently, the glass woven fabric obtained in 1 above was subjected to heat cleaning and then immersed in the above treating solution, after which the solution was squeezed out of the woven fabric by use of a mangle so that the pick-up became 30%. Thereafter, the woven fabric was heated and dried at 110° C. to obtain a glass woven fabric having attached to its surface the silane-coupling agent.

3. Production of Prepreg

The above glass woven fabric was immersed in an epoxy resin varnish having the following composition (G-10 formulation) and then predried to prepare a prepreg having a resin content of 50%:

[Composition of epoxy resin varnish]

| | |
|---|---|
| Epikote 1001 [manufactured by Yuka Shell Epoxy Co., Ltd.] | 80 parts |
| Epikote 154 [manufactured by Yuka Shell Epoxy Co., Ltd.] | 20 parts |
| Dicyandiamide | 4 parts |
| Benzyldimethylamine | 0.2 part |
| Dimethylformamide | 30 parts |

4. Production of Laminate

Two sheets of the above prepreg were superposed one on the other in parallel so that the non-woven portions of the glass woven fabrics which were the base materials of the above prepreg sheets were put one on the other and the glass fiber thread layers of the glass woven fabrics on the adjacent sides between the prepreg sheets were directed to the same direction. Further, a copper foil having a thickness of 18 μm was put on the upper and lower surfaces thereof, and the resulting assembly was heat-molded by conventional procedure to obtain a copper-clad laminate having a thickness of 0.2 mm.

The laminate thus obtained was cut to a size of 300 mm×300 mm so as not to include the woven portion of the glass woven fabric.

EXAMPLE 2

A prepreg having a resin content of 60% was obtained in the same manner as in Example 1, except that the glass woven fabric was replaced with a glass woven fabric base material prepared by weaving under the following conditions:

| Warp thread | ECD450 | 1/0 | Glass thread |
|---|---|---|---|
| Weft thread | ECD450 | 1/0 | Glass thread |
| Thread count of warp | | | 53/25 mm |
| Thread count of weft | | | 53/25 mm |
| Mass | | | 48 g/m² |
| Thickness | | | 0.05 mm |
| Length of non-woven portion | | | |
| Warp direction | | | 350 mm |
| Weft direction | | | 350 mm |
| Weave texture portion | | | |
| Plain weave, width: | | | 5 mm |

Two sheets of this prepreg and a copper foil having a thickness of 18 μm were subjected to lamination in the same manner as in Example 1 to laminate the copper foil to both sides, thereby obtaining a copper-clad laminate having a thickness of 0.1 mm. This laminate was cut to a size of 300 mm×300 mm.

EXAMPLE 3

A prepreg having a resin content of 50% was obtained in the same manner as in Example 1, except that the glass woven fabric was replaced with a glass woven fabric base material prepared by weaving under the following conditions:

| Warp | ECE225 | 1/0 | Glass thread |
|---|---|---|---|
| Weft | ECE225 | 1/0 | Glass thread |
| Thread count of warp | | | 59/25 mm |
| Thread count of weft | | | 59/25 mm |
| Mass | | | 105 g/m² |
| Thickness | | | 0.1 mm |
| Length of non-woven portion | | | |
| Warp direction | | | 350 mm |
| Weft direction | | | 350 mm |
| Weave texture portion | | | |
| Plain weave, width: | | | 5 mm |
| Pattern-holding weave texture portion | | | |
| Plain weave | | | |
| Interval and weave width | | | |
| Interval in warp direction | | | 350 mm |
| Interval in weft direction | | | 350 mm |
| Weave width in warp direction | | | 5 mm |
| Weave width in weft direction | | | 5 mm. |

COMPARATIVE EXAMPLE 1

As the glass woven fabric, WEA116E (manufactured by NITTO BOSEKI CO., LTD.) was used.

A prepreg having a resin content of 50% was obtained in the same manner as in Example 1, except that the glass woven fabric was replaced with a glass woven fabric prepared by plain weave under the following conditions:

| Thread used | ECE225 | 1/0 | Glass thread |
|---|---|---|---|
| Thread count of warp | | | 60/25 mm |
| Thread count of weft | | | 58/25 mm |
| Mass | | | 105 g/m² |
| Thickness | | | 0.1 mm. |

Two sheets of this prepreg were laminated and a copper foil having a thickness of 18 μm was further put on both sides to obtain a copper-clad laminate having a thickness of 0.2

COMPARATIVE EXAMPLE 2

As the glass woven fabric, WEA05E (manufactured by NITTO BOSEKI CO., LTD.) was used.

A prepreg having a resin content of 60% was obtained in the same manner as in Example 1, except that the glass woven fabric was replaced with a glass woven fabric prepared by plain weave under the following conditions:

| | | | |
|---|---|---|---|
| Thread used | ECD450 | 1/0 | Glass thread |
| Thread count of warp | | | 60/25 mm |
| Thread count of weft | | | 46/25 mm |
| Mass | | | 48 g/m$^2$ |
| Thickness | | | 0.05 mm. |

Two sheets of this prepreg were laminated and a copper foil having a thickness of 18 μm was further put on both sides to obtain a copper-clad laminate having a thickness of 0.1 mm.

The copper-clad laminates obtained in Examples 1 and 2 and Comparative Examples 1 and 2 were subjected to measurement of percentage dimensional change and surface smoothness. The measurement results are shown in Tables 1 and 2.

Moreover, the prepregs obtained in Example 1 and Example 3 were subjected to measurement of deflection value of weft thread. The measurement values are shown in Table 3.

<Method of measuring percentage dimensional change>

A copper-clad laminate was subjected to etching treatment to remove the copper file from both sides of the laminate, and thereafter subjected to curing at 170° C. for 30 minutes, after which dimensional change was determined. Incidentally, the percentage dimensional change was determined by calculation on the basis of the original copper-clad laminate.

The results thereof are shown in Table 1.

TABLE 1

| | Percentage dimensional change (%) | |
|---|---|---|
| | Warp direction | Weft direction |
| Example 1 | −0.005 | −0.005 |
| Comp. Example 1 | −0.021 | −0.032 |
| Example 2 | −0.007 | −0.006 |
| Comp. Example 2 | −0.018 | −0.038 |

<Method of measurement of surface smoothness>

A copper-clad laminate was subjected to etching treatment to remove the copper foil from both sides of the laminate, and then subjected to measurement of surface smoothness. The results thereof are shown in Table 2.

Measuring instrument: Surftest-201 (manufactured by Mitsutoyo K. K.)

TABLE 2

| | Surface smoothness (Maximum μm/1 cm) | | |
|---|---|---|---|
| | Warp direction | Weft direction | Oblique direction |
| Example 1 | 1.2 | 1.3 | 1.7 |
| Comp. Example 1 | 2.2 | 3.0 | 3.4 |
| Example 2 | 0.9 | 1.1 | 1.2 |
| Comp. Example 2 | 1.5 | 2.0 | 2.5 |

Method of measuring deflection value of weft of prepreg>

Figure 6:
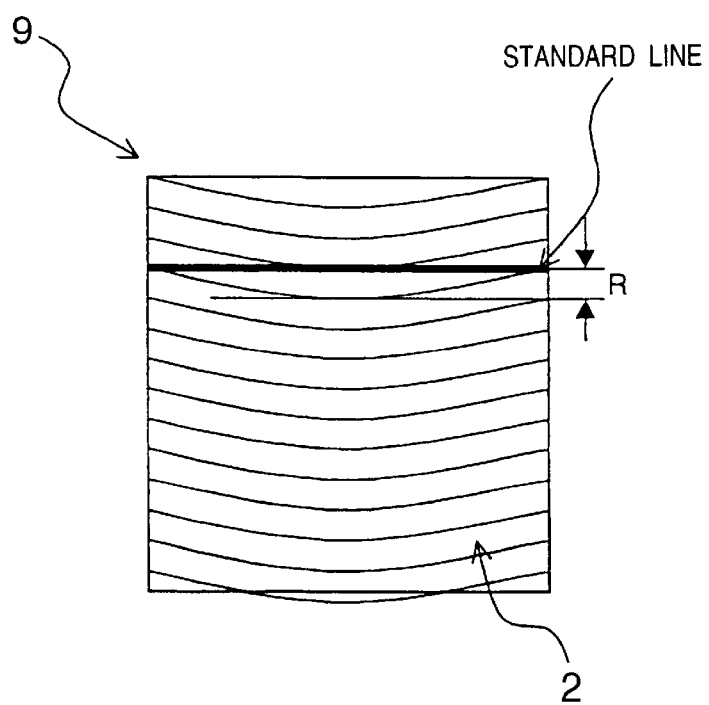
FIG. 6 is a schematic diagram of a method for measuring the deflection of weft in the prepreg.

A prepreg was cut to a size of 300 mm×300 mm and thereafter a standard line vertical to the warp direction of the cut prepreg 9 was drawn as shown in FIG. 6, after which a value R at which the bend of weft 2 became maximum was determined using a stainless ruler specified as first grade in JIS. The results thereof are shown in Table 3.

TABLE 3

| | Maximum bend of warp (mm) |
|---|---|
| Example 1 | 9 |
| Example 2 | 2 |

As is clear from Table 1 and Table 2, it is seen that each of the glass fiber reinforced epoxy resin laminates obtained in Example 1 and Example 2 is superior in dimensional stability and surface smoothness to the glass fiber reinforced epoxy resin laminates obtained in Comparative Example 1 and Comparative Example 2, and has no anisotropy in the warp direction and the weft direction as to the dimensional stability.

Furthermore, as is clear from Table 3, the prepreg obtained in Example 3 is smaller in deflection of weft than the prepreg obtained in Example 1 and a prepreg having a very good appearance can be provided.

INDUSTRIAL APPLICABILITY

As explained above, a laminate for printed wiring board in which the glass woven fabric of this invention is used as a base material is excellent in dimensional stability and surface smoothness. Accordingly, by use of the glass woven fabric of this invention as a base material, it is made possible to produce a printed wiring board which can meet the packaging system by which IC and the like which are used in electronic equipment, computer, communication equipment and the like are automatically inserted. In addition, the glass woven fabric of this invention enables the production of a prepreg having a good appearance in spite of using the same production procedure and production equipment as in the conventional method, so that a laminate having performance equivalent to a laminate for printed wiring board in which the UD material is used as a base material can be obtained with good efficiency without requiring any new investment in plant and equipment.

What is claimed is:

1. A glass woven fabric composed of glass fiber warp threads and glass fiber weft threads, the fabric comprising;

A woven fabric portion having floats extending in intervals of at least 10 mm in each of the warp and weft directions, the floats comprising threads which are successively placed side by side in the portion.

2. The glass woven fabric according to claim 1, wherein the glass fiber woven fabric portion has at its ends weave texture portions of glass fiber, the weave texture of which is selected from the group consisting of plain weave texture, twill weave texture and satin weave texture.

3. The glass woven fabric according to claim 1 or wherein continuous weave texture portions have a width of at least 2 mm, the weave texture of which is selected from the group consisting of plain weave texture, twill weave texture and satin weave texture, exist at intervals of at least 10 mm in the warp direction and/or the weft direction between the non-woven portions of the glass fiber woven fabric portion.

4. The glass woven fabric according to claim 1 wherein the ratio between the glass fiber amounts per 25 mm in the warp and weft directions of the glass woven fabric is 0.7 to 1.4.

* * * * *